(12) United States Patent
Campbell et al.

(10) Patent No.: US 6,320,117 B1
(45) Date of Patent: *Nov. 20, 2001

(54) TRANSPARENT SOLAR CELL AND METHOD OF FABRICATION

(75) Inventors: James P. Campbell, Atherton; Eric W. Galyean, Los Altos Hills; Harvey R. Spreckman, Thousand Oaks, all of CA (US)

(73) Assignee: Xoptix, Inc., Woodland Hills, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/692,366

(22) Filed: Oct. 18, 2000

Related U.S. Application Data

(62) Division of application No. 09/343,069, filed on Jun. 29, 1999, now Pat. No. 6,180,871.

(51) Int. Cl.$^7$ .................... H01L 31/109; H01L 31/045
(52) U.S. Cl. .................... 136/258; 136/261; 136/256; 136/245; 257/51; 257/75; 257/461; 257/74; 438/96; 438/97; 438/98
(58) Field of Search .................... 136/258 AM, 261, 136/258 PC, 256, 245; 257/51, 75, 461, 74; 438/97, 96, 98

(56) References Cited

U.S. PATENT DOCUMENTS

| 4,059,461 | 11/1977 | Fan et al. | 438/92 |
| 4,214,918 | 7/1980 | Gat et al. | 438/618 |
| 4,400,577 | 8/1983 | Spear | 136/259 |
| 4,663,495 | 5/1987 | Berman et al. | 136/248 |
| 4,824,489 | 4/1989 | Cogan et al. | 136/256 |
| 5,192,991 | * 3/1993 | Hosokawa | 136/258 |
| 5,413,959 | 5/1995 | Yamamoto et al. | 438/98 |
| 5,667,597 | * 9/1997 | Ishihara | 136/258 |
| 5,714,404 | * 2/1998 | Mitlitsky et al. | 439/97 |
| 5,886,688 | 3/1999 | Fifield et al. | 345/206 |
| 6,180,871 | * 1/2001 | Campbell et al. | 136/258 |

* cited by examiner

Primary Examiner—Alan Diamond
(74) Attorney, Agent, or Firm—Townsend and Townsend and Crew LLP

(57) ABSTRACT

A transparent solar cell and method of manufacture. The method includes steps of providing a transparent substrate. The method also includes forming a first conductive layer overlying the substrate. The method also includes forming a first amorphous silicon layer of a first dopant type overlying the first conductive layer. A step of annealing the first amorphous silicon layer is included. The method also forms a second amorphous silicon layer of a second dopant type, and also anneals the second amorphous silicon layer. A second conductive layer is formed overlying the second amorphous silicon layer. A combination of these steps forms a transparent solar cell structure.

23 Claims, 7 Drawing Sheets

TRANSPARENT SOLAR CELL AND METHOD OF FABRICATION

CROSS REFERENCE TO RELATED APPLICATIONS

This is a division of U.S. application Ser. No. 09/343,069, filed Jun. 29, 1999, now U.S. Pat. No. 6,180,871 the specification of which is incorporated herein by reference for all purposes.

BACKGROUND OF THE INVENTION

The present invention relates, in general, to electronic devices. More particularly, the present invention provides a transparent solar cell and method of its manufacture.

Solar energy provides many advantages over traditional energy sources. For example, energy from the sun is virtually unlimited and easily accessible throughout the world. It does not require the extraction of a natural resource from the ground to obtain the energy and it can be converted to electricity in a manner that is not harmful to the environment. Solar energy is available whenever the sun is shining and can be collected and stored for use when no light source is available. Therefore, if it can be harnessed economically, it provides an environmentally friendly source of energy that does not deplete or destroy precious natural resources. This is in stark contrast to the use of fossil fuels that are of limited supply and which cause environmental damage with both their use and extraction processes. The use of fossil fuel also requires a constant source of raw materials that may be difficult obtain in many circumstances.

Many different applications benefit greatly from the use of solar energy. For example, buildings and automobiles, with their broad surfaces that are exposed to the sun's energy for much of the day, can use that energy to provide some or all of their energy needs. Various solar cells have been developed using different fabrication techniques to take advantage of this energy source.

One type of solar cell is formed with crystalline silicon. For these solar cells, crystalline silicon is formed by melting silicon and drawing an ingot of crystalline silicon of the size desired. Alternatively, a ribbon of crystalline silicon can be pulled from molten silicon to form a crystalline silicon solar cell. A conductor is placed on either side of the crystalline silicon to form the solar cell. These processes use high temperatures and the solar cells are expensive to manufacture. Packaging is also difficult and expensive and creates a rigid structure. Their maximum size is limited by the manufacturing process. It is difficult to slice the resulting crystalline silicon thin enough to provide a transparent or flexible solar cell. However, these structures are very efficient (relative to other types of presently available commercial solar cells). As such, crystalline solar cells are used primarily for applications where efficiency is more important than cost and where the structures do not need to be flexible. For example, these are commonly used on satellites.

Another type of solar cell is formed with polycrystalline silicon. These may be formed as thin layers on wafers and can thus be made thinner than crystalline silicon solar cells. As is well known in the art, polycrystalline silicon can be formed by heating amorphous silicon. Typically, amorphous silicon begins to crystallize at temperatures greater than about 1400° C. Because of these high temperatures, known processes can only use substrates with high melting points. These processes are not appropriate for substrates made of plastics or other materials that melt at lower temperatures. In the manufacture of flat panel displays, it is known to use lasers to form polycrystalline silicon thin film transistors (TFTs). Such use has not included the formation of P-N junctions or solar cells which presents its own set of challenges. Moreover, these manufacturing processes generally formed single transistors and were not used to form large sheets or areas of polycrystalline silicon. Further, lasers have been used in the manufacture of solar cells, but only as a tool to mechanically form (slice, pattern, etch, etc.) the solar cells.

Another type of solar cell has been formed using doped layers of amorphous silicon. These are not subject to some of the problems inherent in the previously described crystalline silicon or polycrystalline solar cells. First, amorphous silicon can be formed using low temperature processes. Thus, it can be formed on plastic and other flexible substrates. They can also be formed over large surfaces. Second, the processing techniques are less expensive. Nevertheless, amorphous solar cells introduce other significant limitations not found in crystalline silicon or polycrystalline silicon solar cells. For example, hydrogen is generally added during the manufacturing to increase the efficiency of the cell. Amorphous silicon solar cells tend however to lose this hydrogen over time, causing reduced efficiency and reduced usable life. Moreover, amorphous silicon solar cells are not transparent. Thus, they are not appropriate for many applications. For example, buildings and cars with solar cells can be unsightly, and the solar panels may block the view of the outdoors or access to outside light indoors. Also, portable electronics often place a premium on size and surface area. Some devices have displays that cover most—if not all—of the exposed surface of the device. Therefore, it is often undesirable or impossible to mount a traditional amorphous silicon solar cell on the device.

Attempts have been made to solve this transparency problem by making transparent panels from existing solar cell processes. One method has been to take advantage of the "window shade effect" whereby solar cells are formed on a transparent substrate with gaps between adjacent solar cells. This allows some light to pass through to create a transparent effect. The larger the gaps, the more transparency the device has. A disadvantage of this technique is that much of the space is unused, therefore the efficiency of the device is less than it would be if all of the surface area were used for solar cells. Of course, devices of this type also suffer from the problems inherent to the type of cell used. For example, if based on amorphous silicon, these devices suffer from the hydrogen loss exhibited in other amorphous silicon devices.

Other work has been done at making transparent solar cells using materials other than silicon (for example, cadmium telluride (CdTe)). These cells suffer from the challenges inherit to using materials other than silicon.

Thus, a new solar cell and method of fabrication that will avoid these problems is desirable.

SUMMARY OF THE INVENTION

The present invention provides a solar cell and method of its manufacture. It combines the following advantages: 1) is transparent and therefore can be used in places not applicable to existing solar cells 2) is cost effective because it uses thin film amorphous silicon 3) may be readily manufactured because the method for manufacture uses commercially available CVD and laser annealing equipment and 4) can be used on a wide variety of substrates including low temperature substrates.

According to the present invention, a technique including a method and device for fabricating a solar cell is provided.

In an exemplary embodiment, the present invention provides a method and structure which forms a substantially transparent solar cell. The solar cell is thin, flexible, and easy to make and use with conventional semiconductor processes. The solar cell also operates effectively as an optical filter.

In a specific embodiment, the present invention includes a method of forming a solar cell. The method includes steps of providing a substrate, e.g., glass, plastic, Mylar and other substrates, including those with low melting points. The method also includes forming a first conductive layer overlying the substrate. The method also includes forming a first amorphous silicon layer of a first dopant type overlying the first conductive layer. A step of annealing the first amorphous silicon layer is included. The method also forms a second amorphous silicon layer of a second dopant type, and also anneals the second amorphous silicon layer. A second conductive layer is formed overlying the second amorphous silicon layer. A combination of these steps forms a transparent solar cell structure.

In an alternative aspect, the present invention provides a solar cell structure, which is transparent. The structure includes a transparent substrate, which can be selected from glass, crystal, plastic, Mylar, and other substrates, including those that have low melting points. A conductive layer is formed overlying the transparent substrate. A first polycrystalline silicon layer from a first amorphous silicon layer of a first dopant type is formed overlying the first conductive layer. The structure also includes a second polycrystalline silicon layer from a second amorphous silicon layer of a second dopant type overlying the first polycrystalline silicon layer, and a second conductive layer overlying the second polycrystalline silicon layer. The combination of these layers forms a transparent structure.

In a further aspect, the present invention provides a method for fabricating a structure comprising a transparent solar cell structure. The method includes forming a first conductive layer overlying a transparent substrate, and forming a first amorphous silicon layer overlying the first conductive layer. The method also includes converting the first amorphous silicon layer into a first polycrystalline silicon; and forming a second amorphous silicon layer overlying the first amorphous silicon layer. A step of converting the second amorphous silicon layer into a second polycrystalline silicon is included. The method also includes forming a second conductive layer overlying the second amorphous silicon layer. The combination of these steps forms a transparent solar cell structure overlying the substrate.

In still a further aspect, the present invention provides a solar cell comprising a substrate with a melting temperature of less than 450° C., a first conductive layer overlying the substrate, a first polycrystalline film overlying the first conductive layer, a second polycrystalline film overlying the first polycrystalline film, and a second conductive layer overlying the second polycrystalline film.

Numerous advantages are achieved over conventional techniques for forming solar cells. For example, the present method uses conventional equipment and processes from semiconductor operations to manufacture the solar cells. In one aspect of the present invention, an Excimer laser is used to anneal the amorphous silicon layers. Use of this—or a similar laser—allows the forming of polycrystalline silicon without exposing the substrate to high temperature that will distort or destroy it. Therefore, low melting point materials such as plastic may be used. The present solar cells can be transparent, which makes them desirable for placing over glass and other see-through structures. In other aspects, the present invention is easy to implement and control. The present cell structure is extremely thin and efficient and can be implemented on a variety of applications. For example, it can be formed on a flexible substrate and substantially maintain the flexibility of the substrate. Depending upon the embodiment, one or more of these advantages may exist. Other advantages may also exist depending upon the embodiment.

A further understanding of the nature and advantages of the inventions presented herein may be realized by reference to the remaining portions of the specification and the attached drawings.

DESCRIPTION OF THE SPECIFIC EMBODIMENTS

Figure 1:
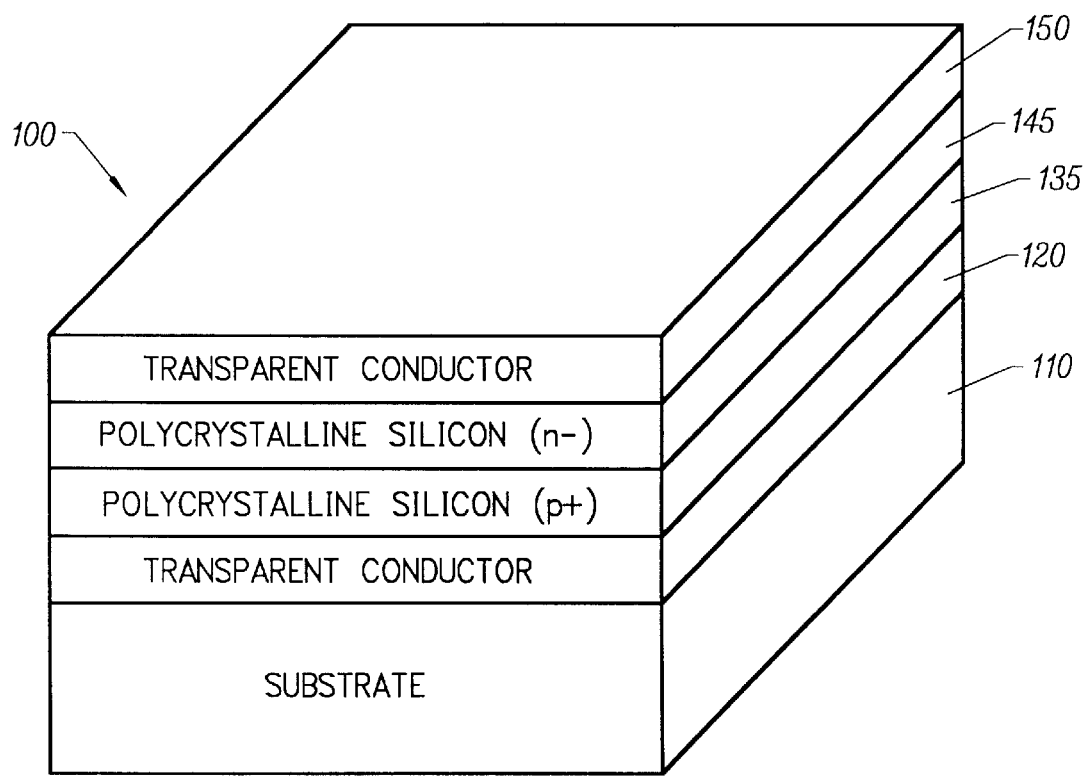
FIG. 1 is a cross-sectional diagram of a transparent solar cell according to the present invention.

FIG. 1 is a cross-sectional diagram of an embodiment of a solar cell 100 according to the present invention. While referred to generically herein as a solar cell, solar cell 100 also may operate efficiently as an optical filter. It may be used as a solar cell exclusively, an optical filter exclusively, or as a combination solar cell and optical filter.

Solar cell 100 may be fabricated in sheets of a size appropriate for its intended use. It may also be fabricated on small substrates or in configurations other than sheets. For example, solar cell 100 may be fabricated as a small device for a hand-held electronic device or on large sheets to be applied to large areas such as windows, buildings and automobiles. In contrast to existing amorphous silicon solar cells, solar cell 100 is transparent. In this context, transparency is defined as having the property of transmitting light without appreciable scattering so that bodies lying beyond are seen clearly. In the specific embodiment, the reflective component is very low; however, the amount of reflection is controllable as will be discussed in more detail below.

Solar cell 100 has a substrate layer 110 providing a base structure for the device. Substrate layer 110 may be a flexible material or a rigid material depending on its intended use. A first conductive layer 120 overlies substrate 110. A P-N junction overlies first conductive layer 120. The P-N junction is formed by a p+doped transparent polycrystalline silicon layer 135 and an n–doped transparent polycrystalline silicon layer 145. In other embodiments (not shown), the order is reversed and p+ polycrystalline silicon layer 135 is formed above n– polycrystalline layer 145. The p+ doped polycrystalline silicon layer 135 and the n– doped polycrystalline silicon layer 145 may obtain their transparency by virtue of their method of fabrication as will be described in detail below. A second conductive layer 150 resides above the P-N junction.

Because of its transparent nature, solar cell 100 can be placed unobtrusively over a variety of surfaces for generating electricity. For example, it can be used as window covering on buildings or automobiles, while maintaining the aesthetics and functionality of the window. Such a window covering can absorb some of the photons from sunlight or other light sources to produce electricity, while allowing those photons not absorbed to pass through to the other side. Thus, the view through the covered window is not completely blocked. Similarly, solar cell 100 can cover a display from a laptop computer or other electronic device such that it can gather light and generate electricity whether the device is in operation or not. Such electronic devices may include portable telephones, laptop computers, palm top computers, electronic watches, etc. While this is a list of some of its applications, it is of course not exhaustive. One can readily identify many applications in which transparent solar cell 100 might be used to generate electricity while not obscuring in any significant degree, the view of the user.

In another embodiment of the present invention, solar cell 100 may operate effectively as an optical filter. In yet another embodiment, it may operate as both a solar cell and an optical filter. It filters out light in undesirable frequencies, while allowing light in the visible frequencies to pass through. Because of its low reflectivity, it may also be used in applications that benefit from anti-reflective coatings. While it is referred to herein generically as solar cell 100, it is specifically intended that the term include its usage as an optical filter as well.

Figure 2:
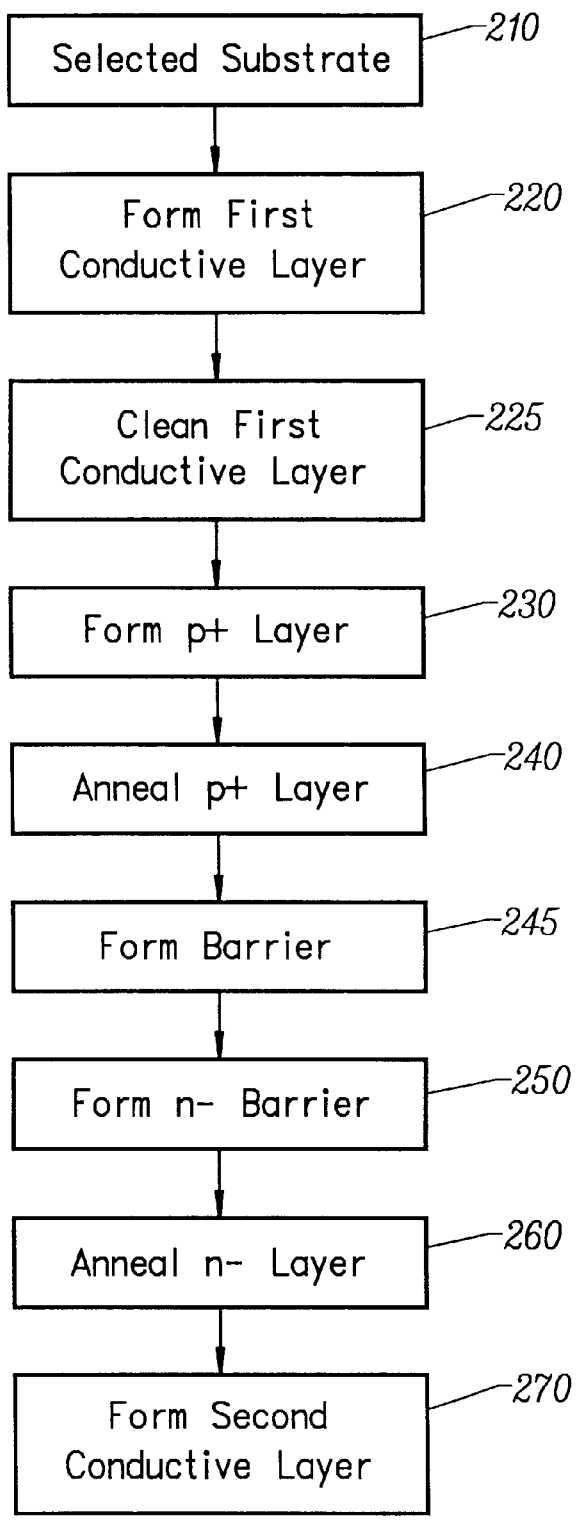
FIG. 2 is a flow diagram showing a method of fabricating solar cells according to the present invention.

FIG. 2 shows a flow diagram of a method of fabricating solar cell 100 according to the present invention. While FIG. 2 shows a specific embodiment, it is not intended that this be the only way such a transparent solar cell may be fabricated. One of skill in the art will recognize that other variations of the invention are readily apparent from the specific embodiment described herein.

Figure 3:
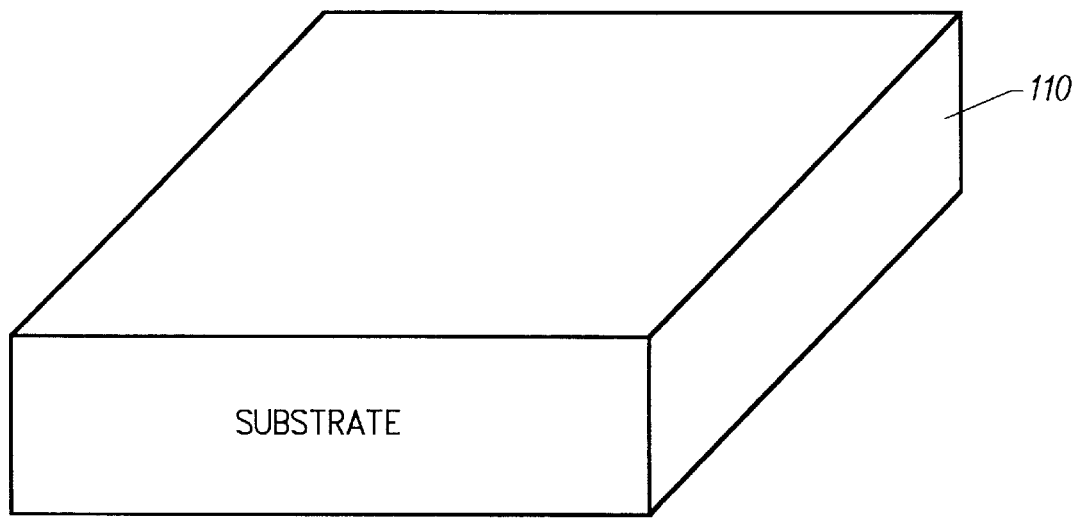
FIGS. 3–8 are cross-sectional diagrams of the solar cell of the present invention at various steps of fabrication.

Referring to the flow diagram of FIG. 2, in step 210 a suitable substrate 110 is provided upon which solar cell 100 may be fabricated. FIG. 3 shows a cross-section of the device at step 210 of the fabrication. Substrate 110 may be a rigid or flexible material. For example, flexible substrates such as plastic, Mylar or Polyolifin may be used. Rigid substrates such as glass, crystal, acrylic, or ceramic may also be used. Significantly, substrate 110 need not be a material with a high melting point compared to the temperature at which amorphous silicon crystallizes. Instead, it may include plastics and other materials that have relatively low melting temperatures. This is in stark contrast to previously known crystalline solar cells that required the use of a substrate of a high melting point to withstand the fabrication process. One of skill in the art will recognize many acceptable material for substrate 110 and any may be used without departing from the present invention. The selection of a rigid or flexible substrate 110 is arbitrary except to the extent that a rigid or flexible structure is more appropriate for the end use of solar cell 100. Depending upon the embodiment, substrate 110 may also be coated with a variety of materials. The substrate can also be dyed.

Figure 4:
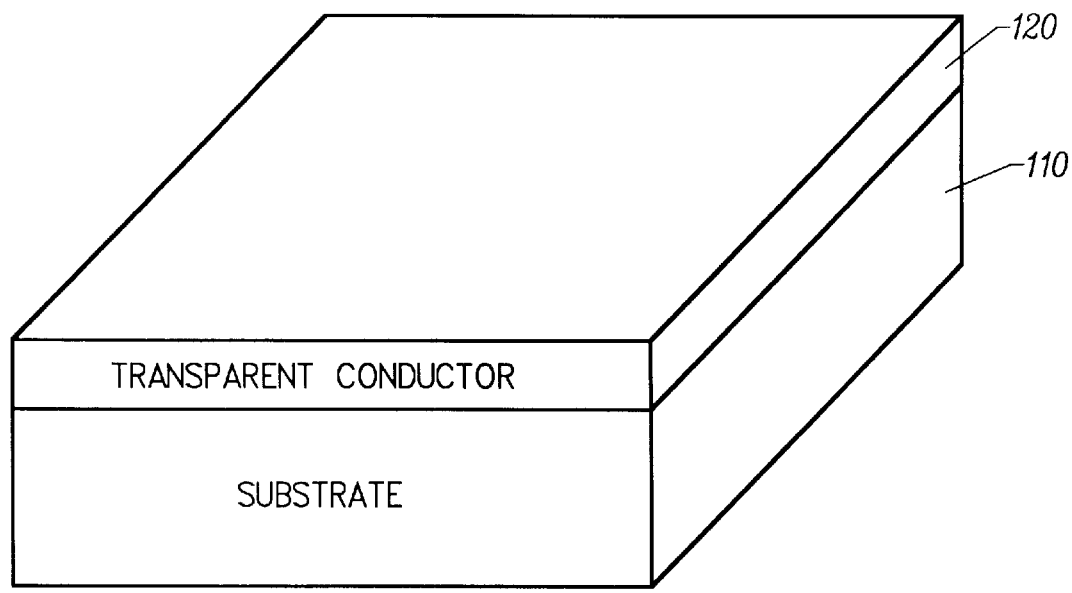

In step 220, a first conductive layer 120 is formed on substrate 110 as depicted in FIG. 4. In the specific embodiment, conductive layer 120 is indium tin oxide (ITO) that is deposited by chemical vapor deposition (CVD). Other materials for conductive layer 120 include magnesium fluoride, aluminum, tungsten, titanium nitride, gold, silver, etc. In an embodiment of the present invention, a flash of silver, aluminum, titanium or other reflective coating may be used to provide a more reflective solar cell. The specific embodiment has an ITO thickness of approximately one half micron over the area of interest; however, other thicknesses may be appropriate for different applications and materials. Its thickness is a function of the desired amount of transparency, conductivity, and flexibility. It may be desirable for conductive layer 120 to be annealed after it has been deposited. Such annealing improves mobility of electrons and holes in conductive layer 120. Conductive layer 120 may also be deposited or formed in other ways besides CVD. First conductive layer 120 may be a single layer or multiple layers, depending upon the embodiment.

In step 225, first conductive layer 120 is optionally cleaned using any of a variety of techniques well known in the art. Such techniques include metal etching, laser scan, etc.

Figure 5:
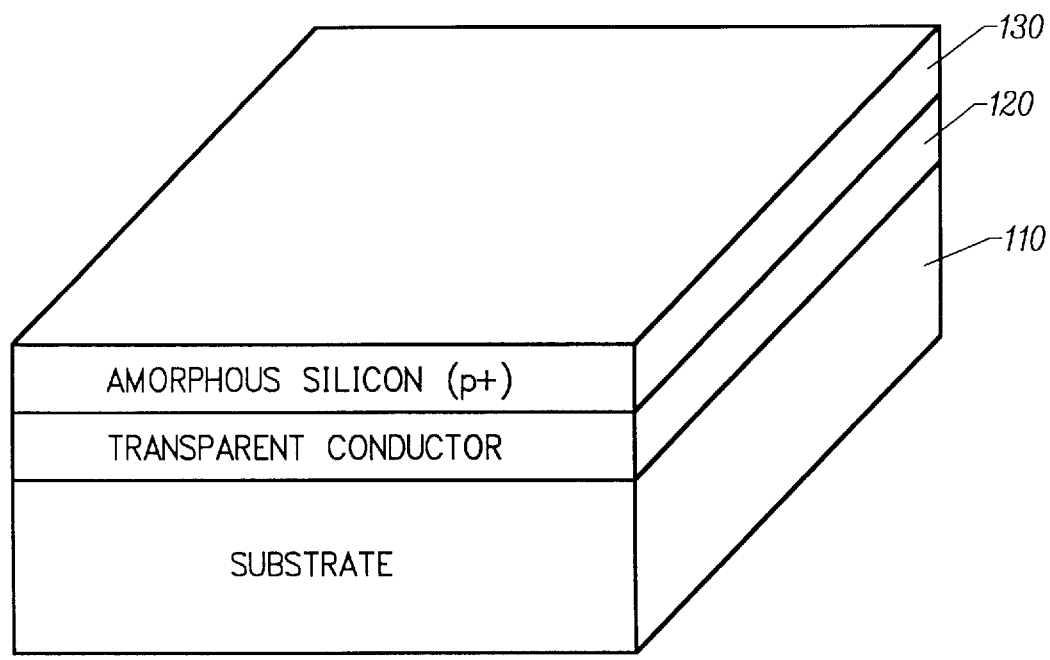

In step 230, a first doped amorphous silicon layer 130 is formed overlying the region of interest of conductive layer 120. The resulting structure is shown in FIG. 5. In the specific embodiment, amorphous silicon layer 130 is a p+ type material. It is in-situ doped using CVD with boron at concentration such as are commonly used for producing solar cells. In other embodiments, amorphous silicon layer 130 may be formed by implantation or diffusion processes. First amorphous silicon layer 130 preferably has a thickness of at least 300 Å at its thinnest points and a nominal thickness of at least 500 Å across its surface. Its maximum thickness is about 1,000 Å in the specific embodiment due to limits on the effectiveness of the Excimer laser to convert amorphous silicon to polycrystalline silicon (see step 240 below). Of course, it will be recognized that new techniques, processes and materials may be developed that will have different minimum and maximum specifications.

Figure 6:
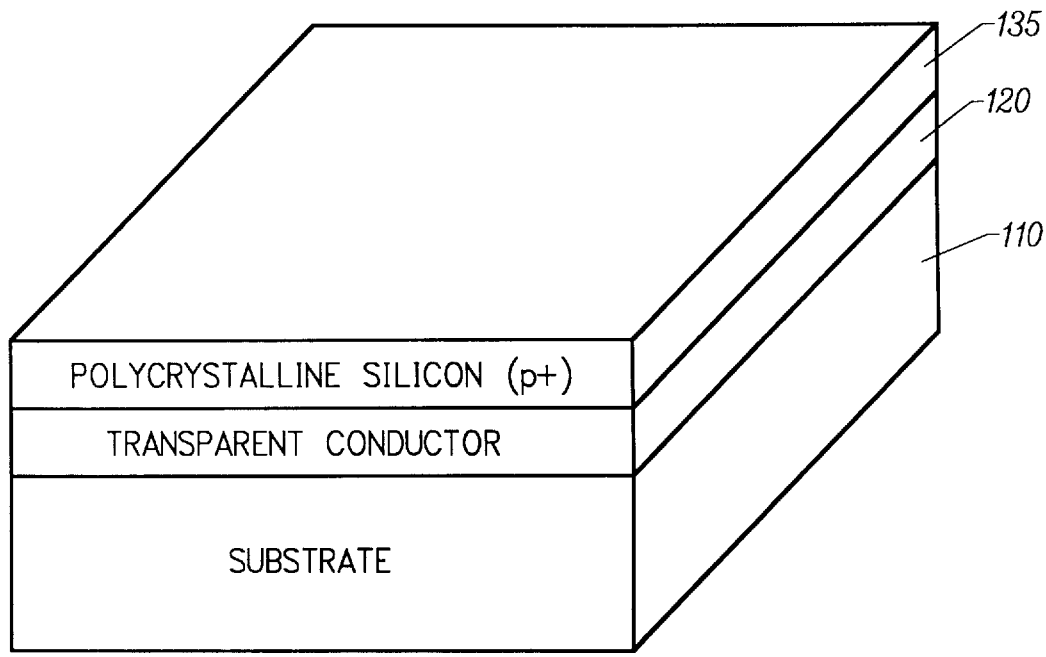

Next, in step 240, first amorphous silicon layer 130 is annealed at high temperature by applying rapid thermal energy to the region, thereby converting amorphous silicon layer 130 to transparent polycrystalline silicon layer 135. In this context, annealing is defined as the process of converting amorphous silicon to polycrystalline silicon. The resulting structure is depicted in FIG. 6. In the specific embodiment, this annealing is accomplished with a pulsed Excimer laser, which is a gas laser using xenon chloride. The Excimer laser heats up the material at approximately 1,000,000 degrees per second allowing first amorphous silicon layer 130 to be rapidly annealed. Other types of lasers or other rapid thermal energy devices may also be preferably used to perform this annealing. For example, a diode laser that has been frequency converted to ultraviolet frequencies, a diode crystal laser that has been frequency converted to ultraviolet frequencies, and a diode pumped crystal (YAG or YELF) laser that has been frequency converted to ultraviolet frequencies are examples of lasers that may be used, although the present invention is not limited to only these types of lasers.

The Excimer laser outputs a beam that effectively converts amorphous silicon to polycrystalline silicon for a depth of approximately 1,000 Å. Because it heats up only such a relatively short distance into the structure, the underlying substrate is not subjected to the high temperatures to which the amorphous silicon layer is subjected. Therefore, in contrast to other methodologies, the substrate may be of a low melting point material such as plastic. In the specific embodiment, the Excimer laser is operated at 248–308 nm at, typically, 600 mJ/cm$^2$, with a pulse duration of no more than 50 nanoseconds, but typically 45 nanoseconds.

In applications in which the substrate can be processed at moderately high temperatures (for example, glass at 550 degrees C.,) rapid thermal annealing of amorphous silicon into polycrystalline silicon could alternatively be done using flash lamps or similar devices (e.g. pulsed $CO_2$ lasers).

This annealing step also serves to activate the p-type dopant. In the specific embodiment, the underlying substrate may be preheated to a temperature below the melting point of the substrate before applying the laser. In the specific embodiment, this preheating is approximately 300 to 350 degrees. Other embodiments may not use any preheating at all.

The amorphous silicon deposition process of step 230 and the thermal annealing process of step 240 results in a particular grain size for polycrystalline silicon layer 135. In the specific embodiment, the root mean square (RMS) of grain sizes is between 0.25 microns and 0.50 microns. The grain size is preferably between 0.1 micron and 2.0 microns.

In step 245, a temporary barrier (not shown) is formed overlying polycrystalline silicon layer 135. This step is optional and may be skipped in some embodiments. The barrier is preferably a 50 Å thick layer of $SiO_2$, a nitride, or other dielectric material. Its purpose is to seal polycrystalline silicon layer 135 from a subsequent oppositely doped layer. The barrier is intended to be temporary and may be removed in later processing.

Figure 7:
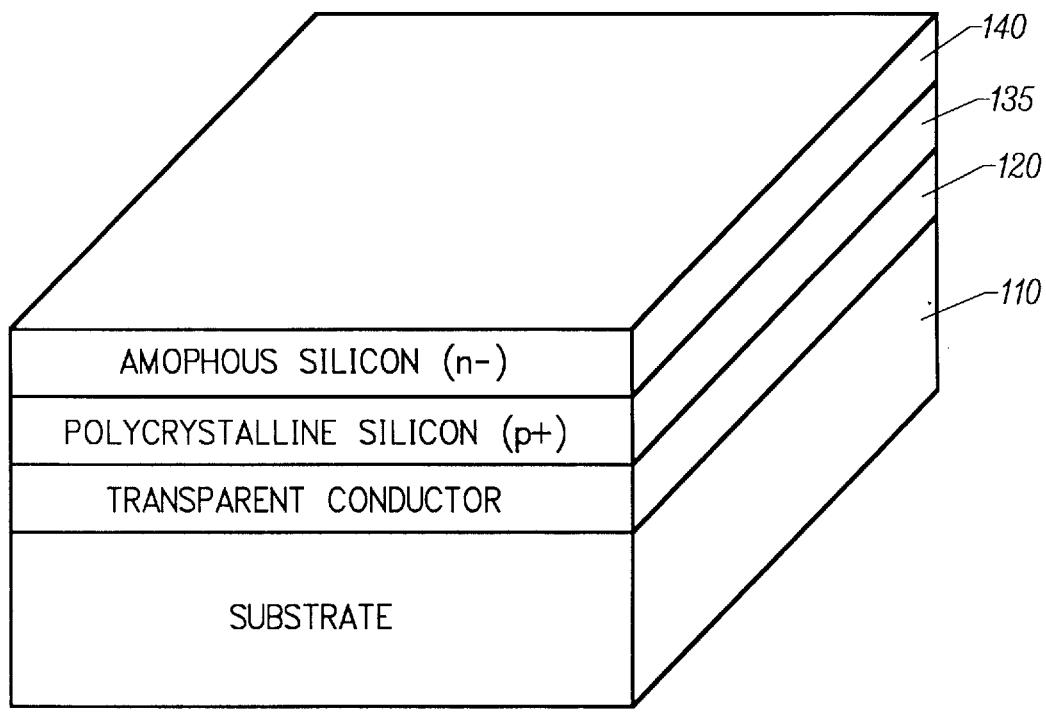

In steps 250, second doped amorphous silicon layer 140 is formed overlying polycrystalline silicon layer 135. Amorphous silicon layer 140 is oppositely doped from amorphous silicon layer 130. The resulting structure is shown in FIG. 7. In the specific embodiment, amorphous silicon layer 140 is doped with an n-type material such as phosphene or other n-type dopant. It may be formed with in-situ doping and CVD deposition. Other embodiments may reverse the order of the different dopant types in amorphous silicon layers 130 and 140 so that the p-type layer overlies the n-type layer. Amorphous silicon layer 140 may alternatively be doped by implantation or diffusion.

Figure 8:
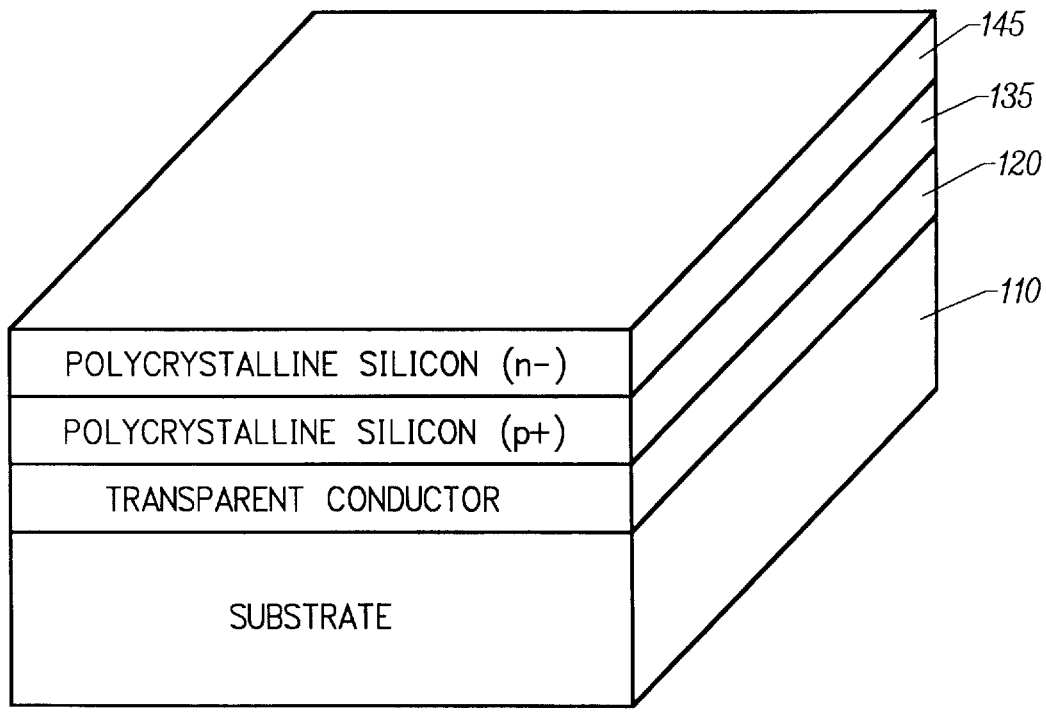

In step 260, amorphous silicon layer 140 is annealed using the Excimer laser or other rapid thermal energy process as described in step 240. This results in a transparent polycrystalline silicon layer 145. The resulting structure is shown in FIG. 8. Step 260 also activates the dopant. The barrier formed in step 245 may be removed during the annealing process leaving a P-N junction between layers 135 and 145.

In step 270, a second conductive layer 150 is formed above the P-N junction resulting in solar cell 100 as shown in FIG. 1. In the specific embodiment, the second conductive layer is also ITO that is deposited with CVD at a thickness of about one-half micron over the area of interest. Again, its maximum thickness is dependent upon the desired transparency, conductivity, and flexibility. Second conductive layer 150 may also be optionally annealed to improve the mobility of the electrons and holes.

Steps 220–270 may be performed using a roll-to-roll coater. Such roll-to-roll coaters are well known in the art. Using this technique, large sheets of solar cells 100 may be formed on large rolls of a substrate such as plastic. Processing steps 220–270 are performed with equipment located between the two rolls of the roll-to-roll coater. The Excimer laser is one of these pieces of equipment. It typically outputs a beam that is 0.6 mm wide and extends across the substrate. Multiple lasers may be also be used together to increase the rate of processing over large surface areas. The rolls of plastic may be moved so the entire substrate is exposed to the laser. Alternatively, the laser may be moved over the substrate instead of moving the substrate.

Figure 9A:
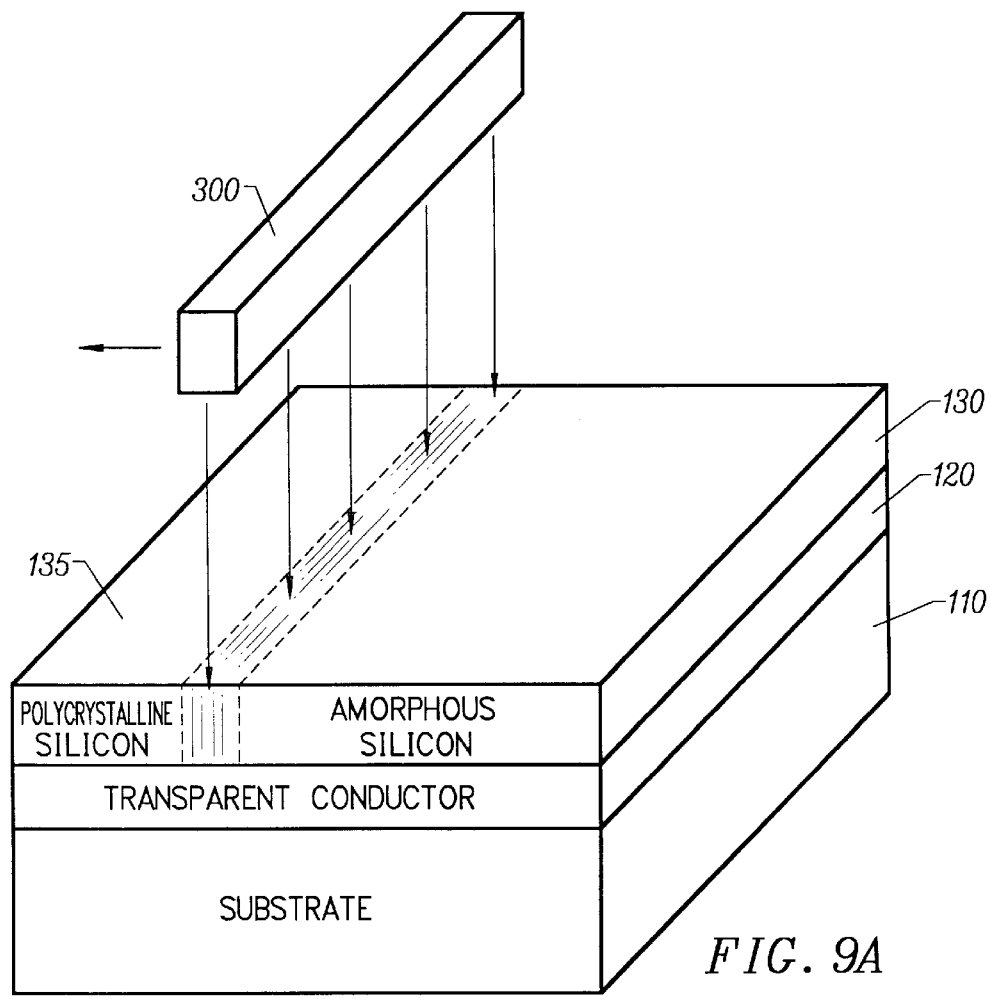
FIG. 9A shows a cross section of the solar cell during an embodiment of annealing process.
Figure 9B:
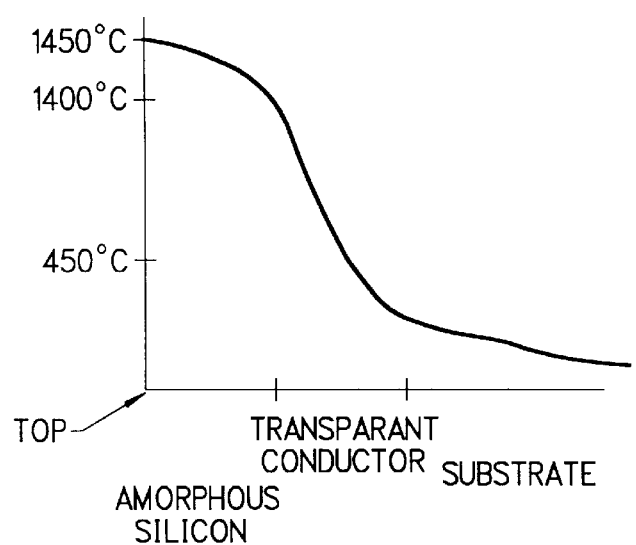
FIG. 9B shows a thermal graph of the solar cell's temperature through its depth during the annealing process.

FIG. 9A shows a cross section of solar cell 100 during an embodiment of annealing process of step 240. A sheet of substrate 110 has already been layered with transparent conductor 120 and amorphous silicon 130. A laser 300 resides above the sheet and transmits thermal energy into amorphous silicon 130 converting it to polycrystalline silicon 135 as the sheet moves past laser 300. As described above, laser 300 may be an Excimer laser or other type of laser. The thermal energy output of laser 300 is such that amorphous silicon layer 130 is heated above approximately 1400° C. to convert it to polycrystalline silicon, but substrate 110 remains below 450° C. FIG. 9B shows a thermal graph of the temperature of the sheet through its depth. At the top of amorphous silicon 130, the temperature may be 1450° C. while at the bottom it is approximately 1400° C. Through transparent conductor 120 the temperature declines rapidly until it is less than 450° C. at substrate 110. In the specific embodiment, the laser moves across the sheet slow enough that each pulse of the laser overlaps the portion that was previously exposed to the beam. Preferably the overlap is two thirds the width of the beam. A typical scan rate is 60 mm per second.

In operation, electrodes are provided to each of the p+ and n– polycrystalline silicon layers 135 and 145 to form an electrical circuit. In the presence of optical radiation, the P-N junction of the specific embodiment develops a typical 0.46 volt potential at approximately 7 $mA/cm^2$ in sunlight. However, it can be constructed such that a wide range of power output is provided. Such outputs can vary by orders of magnitude. The size of the area, the quantum efficiency of the cell (electron-hole mobility/absorptivity) and the energy level of the instant optical energy determines the amount of optical energy converted to electrical current. A typical design efficiency is about 2–3% or better, as compared with an opaque crystalline solar cell with an efficiency of 13%. An advantage of solar cell 100 is that it does not depend on hydrogen as a carrier, so it does not suffer from the efficiency loss that amorphous silicon does. Thus, its lifetime is extended over that of amorphous solar cells.

In another embodiment of the present invention, multiple layers of P-N junctions may be formed by repeating steps 220–270. The resulting multiple layer solar cell may increase the efficiency to more closely resemble that of crystalline solar cells. FIG. 9 is a cross-sectional diagram of a resulting multiple layer solar cell 900. Although solar cell 900 shows only two levels of solar cells, any number may be formed. Since these layers are transparent, the resulting solar cells in the lower levels are exposed to the light even though they are underneath other solar cells. This may be desirable for some applications to increase the efficiency and extend the life of the resulting structure.

Figure 10:
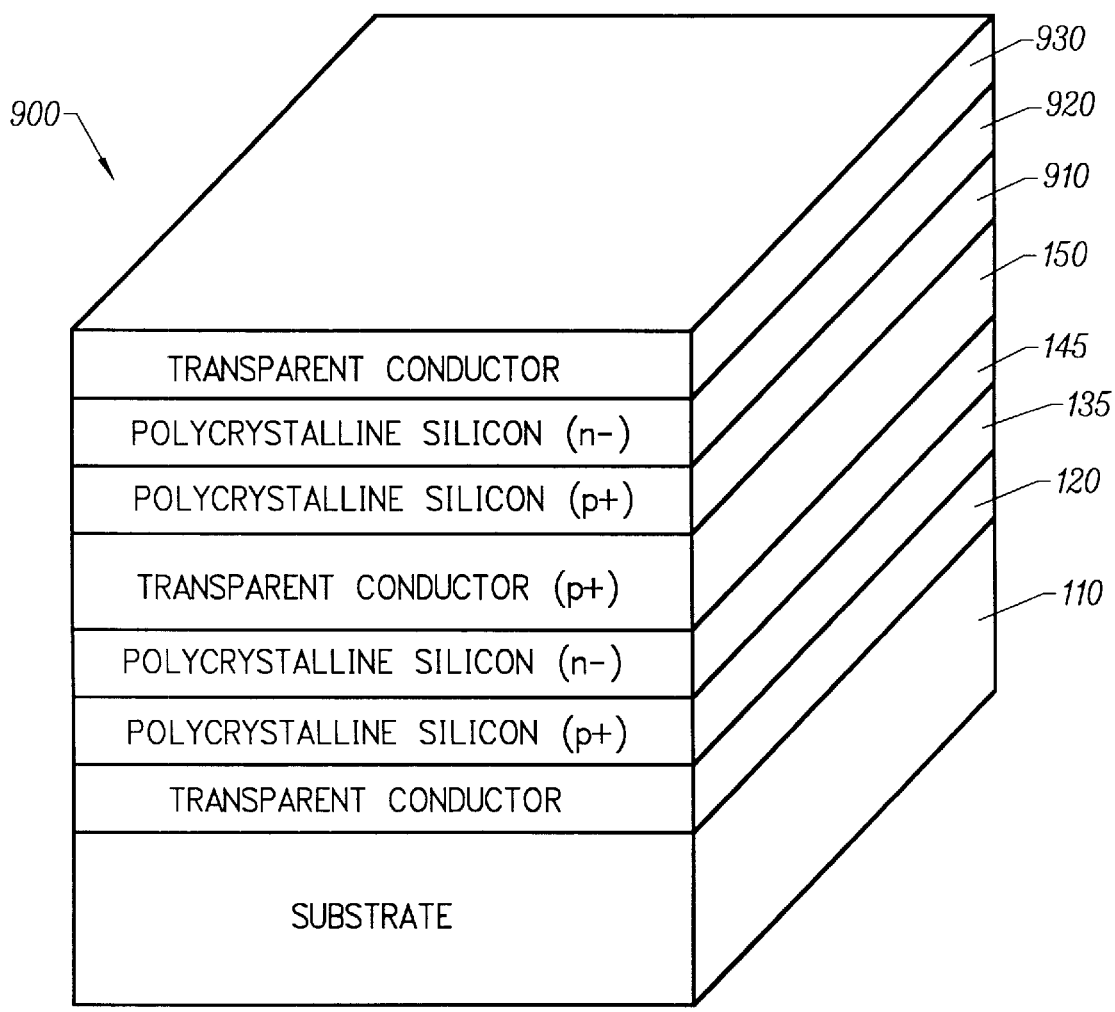
FIG. 10 is a cross-sectional diagram of a multiple layer solar cell of the present invention.

Referring to FIG. 10, a single layer solar cell such as solar cell 100 is formed and an additional solar cell is formed above it to form a multiple layer solar cell 900. In some embodiments, second transparent conductor 150 is thicker than first transparent conductor 120. In other embodiments it is the same thickness. In still other embodiments, a dielectric layer (not shown) is formed on another conductive layer (not shown) is formed above the dielectric layer.

A second p+ polycrystalline layer 910 is formed by forming a p+ amorphous silicon layer and annealing it as described above. A second n– polycrystalline layer 910 is formed above second p+ polycrystalline layer 910 by forming an n– amorphous silicon layer and annealing it. A third transparent conductor 930 is formed above that. This process may be repeated to form as many layers as is desirable.

As described briefly above, the reflectivity of solar cell 100 may be varied depending on the application. In some embodiments, it is desirable that the outer conductive layer (i.e., second conductive layer 150) be as anti-reflective as possible, while the inner conductive layer (i.e., first conductive layer 120) is reflective. Such a design will allow the maximum amount of sunlight to be absorbed since it passes through solar cell 100 as it enters and as it is reflected back. Other embodiments may make use of various reflective qualities for functional or aesthetic reasons.

To provide the reflectivity, an embodiment substitutes a flash of silver, aluminum, titanium or other reflective conductor instead of a transparent conductor such as ITO. This substitution can be made on any or all of the conductive layers, depending on the desired reflectivity.

In other embodiments of the present invention, solar cell 100 may also be used as an optical filter. Using the above-described methodology, solar cell 100 provides a photopic response that is very similar to that of the human eye. That is, it absorbs about 20–80% of those light frequencies which are visible to the human eye, while allowing the rest of the visible light to pass through. It can be used as an optical filter alone, or in combination with its use as a solar cell.

While a specific embodiment has been described herein, it will be recognized that the present invention is not limited to the specific embodiment described. For example, the p+ and n− layers 135 and 145 may be reversed. Also, different or new fabrication techniques may be used or other changes made that do not depart from this spirit and scope of the present invention. The invention is intended to be limited only by the attached claims.

What is claimed is:

1. A method of forming a solar cell comprising:

providing a substrate;

forming a first layer of conductive material overlying the substrate;

forming a second layer of amorphous silicon of a first dopant type overlying the first layer;

annealing the second layer to convert the amorphous silicon of the second layer into polycrystalline silicon;

forming a third layer of amorphous silicon of a second dopant type overlying the second layer forming a p-n junction between the second layer and the third layer;

annealing the third layer to convert the amorphous silicon of the third layer into polycrystalline silicon; and forming a fourth layer of conductive material overlying the third layer.

2. The method of claim 1 wherein the first dopant type is p+.

3. The method of claim 2 wherein the second dopant type is n−.

4. The method of claim 1 wherein the melting point of the substrate is less than 450° C.

5. The method of claim 1 wherein the first layer is formed by an annealing step.

6. The method of claim 1 wherein the annealing of the second layer is done by applying thermal energy while maintaining the substrate at a temperature of less than 450° C.

7. The method of claim 1 wherein the annealing of the second layer comprises application of thermal energy with a laser.

8. The method of claim 7 wherein the laser is a pulsed Excimer laser.

9. The method of claim 1 wherein the first layer is Indium Tin Oxide.

10. A method for fabricating a structure comprising a transparent solar cell structure, the method comprising:

forming a first layer overlying a transparent substrate;

forming a second layer of amorphous silicon overlying the first layer, the second layer being of a first impurity type;

converting the second layer into polycrystalline silicon;

forming a third layer of amorphous silicon overlying the second layer, the third layer being of a second dopant type forming a p-n junction between the second layer and the third layer;

converting the third layer into polycrystalline silicon; and forming a fourth layer of conductive material overlying the third layer.

11. The method of claim 10 wherein the first layer, the second layer, the third layer, and the fourth layer define a solar cell device.

12. The method of claim 10 wherein the second layer includes a thickness of 1000 Å and less, which provides a transparent structure.

13. The method of claim 10 wherein the third layer includes a thickness of 1000 Å and less, which provides a transparent structure.

14. The method of claim 10 wherein the converting of the second layer is provided using a rapid thermal anneal process, the rapid thermal anneal process maintaining a temperature of less than about 450° C. at the transparent substrate.

15. The method of claim 10 wherein the converting of the third layer is provided using a rapid thermal anneal process, the rapid thermal anneal process maintaining a temperature of less than about 450° C. at the transparent substrate.

16. The method of claim 10 wherein the converting of the second layer is provided using a laser.

17. A method for fabricating a structure comprising a transparent solar cell structure, the method comprising:

providing a substrate;

forming a first layer of conductive material overlying the substrate;

forming a second layer of amorphous silicon overlying the first layer, the second layer being of a first impurity type;

converting the second layer into polycrystalline silicon;

forming a third layer of amorphous silicon overlying the second layer, the third layer being of a second dopant type;

converting the third layer into polycrystalline silicon;

forming a fourth layer of conductive material overlying the third layer;

forming a fifth layer of amorphous silicon overlying the fourth layer;

converting the fifth layer into polycrystalline silicon;

forming a sixth layer of amorphous silicon overlying the fifth layer;

converting the sixth layer into polycrystalline silicon; and forming a seventh layer of conductive material overlying the sixth layer.

18. The method of claim 17 wherein the converting of at least one of the second, third, fifth and sixth layers is done while maintaining the substrate at a temperature of less than 450° C.

19. The method of claim 17 wherein the converting of each of the second, third, fifth and sixth layers is done while maintaining the substrate at a temperature of less than 450° C.

20. The method of claim 17 wherein the converting of at least one of the second, third, fifth and sixth layers is done using an Excimer laser.

21. The method of claim 17 wherein the third layer directly overlies the second layer with no intervening layers.

22. A solar cell structure comprising:
- a substrate with a melting temperature of less than 450° C.;
- a first conductive layer overlying the substrate;
- a first polycrystalline film overlying the first conductive layer;
- a second polycrystalline film overlying the first polycrystalline film;
- a second conductive layer overlying the second polycrystalline film;
- a third polycrystalline film overlying the second conductive layer;
- a fourth polycrystalline film overlying the third polycrystalline film; and
- a third conductive layer overlying the fourth polycrystalline film.

23. The solar cell structure of claim 22 wherein the second polycrystalline film directly overlies the first polycrystalline film with no intervening layer.

* * * * *